US012764918B2

(12) United States Patent
Schilling

(10) Patent No.: US 12,764,918 B2
(45) Date of Patent: Oct. 13, 2026

(54) RFID CONVERSION INSTALLATION AND CONTROL METHOD FOR A PLURALITY OF INLAY DISPENSING MODULES

(71) Applicant: BW Papersystems Stuttgart GmbH, Nürtingen (DE)

(72) Inventor: Andreas Schilling, Lichtenstein (DE)

(73) Assignee: BW Papaersystems Stuttgart GmbH, Nürtingen (DE)

( * ) Notice: Subject to any disclaimer, the term of this patent is extended or adjusted under 35 U.S.C. 154(b) by 268 days.

(21) Appl. No.: 18/686,701

(22) PCT Filed: Jul. 7, 2022

(86) PCT No.: PCT/EP2022/068843
§ 371 (c)(1),
(2) Date: Feb. 26, 2024

(87) PCT Pub. No.: WO2023/030725
PCT Pub. Date: Mar. 9, 2023

(65) Prior Publication Data

US 2024/0381602 A1 Nov. 14, 2024

(30) Foreign Application Priority Data

Aug. 30, 2021 (DE) ..................... 10 2021 122 365.2
Sep. 13, 2021 (DE) ..................... 10 2021 123 632.0
Dec. 3, 2021 (DE) ..................... 10 2021 131 911.0

(51) Int. Cl.
*H05K 13/04* (2006.01)
*G06K 19/07* (2006.01)

(52) U.S. Cl.
CPC ......... *H05K 13/04* (2013.01); *G06K 19/0723* (2013.01)

(58) Field of Classification Search
CPC ............... H05K 13/04; G06K 19/0723; G06K 19/07718; G06K 19/07749; B31D 1/028
(Continued)

(56) References Cited

U.S. PATENT DOCUMENTS 7,375,636 B1 * 5/2008 Martin .............. G01R 31/2822 340/505
2003/0227528 A1 12/2003 Hohberger
(Continued)

FOREIGN PATENT DOCUMENTS

DE 102006026105 A1 1/2007
DE 102006052517 A1 5/2008
(Continued)

OTHER PUBLICATIONS

International Search Report and Written Opinion in PCT/EP2022/068843, 6 pages, dated Nov. 15, 2022.

*Primary Examiner* — Omar Casillashernandez
(74) *Attorney, Agent, or Firm* — Andrus Intellectual Property Law, LLP

(57) ABSTRACT

Represented and described is an RFID conversion system for producing RFID products on one and/or more tracks, with a plurality of inlay dispensing modules and with a control device for controlling the inlay dispensing modules. According to the invention, it is provided that each inlay dispensing module is meant and configured for directly loading inlays onto a carrier material, in particular a web shaped or sheet shaped carrier material, or for indirectly loading inlays onto a transport means, such as a vacuum conveyor belt, wherein the inlay dispensing modules can be controlled independently of each other.

18 Claims, 8 Drawing Sheets

(58) Field of Classification Search
USPC .......................................................... 340/12.51
See application file for complete search history.

(56) References Cited

U.S. PATENT DOCUMENTS

| | | | | |
|---|---|---|---|---|
| 2007/0040688 | A1* | 2/2007 | Cocita .............. | G06K 19/07745<br>343/895 |
| 2008/0088448 | A1* | 4/2008 | Steidinger ................ | H01Q 1/40<br>343/873 |
| 2009/0315718 | A1* | 12/2009 | Azuma ............ | G06K 19/07749<br>340/572.1 |
| 2010/0326581 | A1* | 12/2010 | Roseman .............. | B65C 9/1865<br>156/60 |

FOREIGN PATENT DOCUMENTS

| | | | |
|---|---|---|---|
| DE | 102018120496 | A1 | 2/2020 |
| WO | 2014076046 | A1 | 5/2014 |

* cited by examiner

RFID CONVERSION INSTALLATION AND CONTROL METHOD FOR A PLURALITY OF INLAY DISPENSING MODULES

CROSS REFERENCE TO RELATED APPLICATIONS

The present application is the U.S. national stage application of international application PCT/EP2022/068843 filed Jul. 7, 2022, which international application was published on Mar. 9, 2023, as International Publication WO 2023/030725 A1. The international application claims priority to German Patent Application No. 102021122365.2, filed Aug. 30, 2021; German Patent Application No. 102021123632.0, filed Sep. 13, 2021; and German Patent Application No. 102021131911.0, filed Dec. 3, 2021. The international application and German applications are hereby incorporated by reference herein in their entireties.

BACKGROUND

The invention relates to an RFID conversion system for producing RFID products on one and/or more tracks and to a control method for controlling inlay dispenser modules of an RFID conversion system.

RFID technology is used for the contactless transmission of information. The relevant information is stored onto a passive transponder, the core component of which is a microchip. The microchip is connected with an antenna structure, which is usually applied onto a thin plastic film or paper. A read/write device emits a radio signal in a specific frequency band. These radio waves induce an electrical voltage in the antenna structure of the passive transponder, which is sufficient to activate the microchip and thus process data. RFID transponders are used, for example, in chip cards, tickets, playing cards, tokens, stickers and labels, such as clothing labels and shipping labels, as well as baggage tags.

Due to the sensitivity of the thin carrier material of the antenna with the microchip attached to it, the antenna with the fixed chip is inserted into multilayer RFID products using RFID conversion systems. This protects the antenna and the chip and, if necessary, also achieves a look, feel and robustness according to the respective application. In addition, a pitch change is possible, which may be intended in particular for cost reasons and to save material. The term "pitch" refers onto the distance between adjacent RFID chips. RFID conversion systems are used for producing ready made RFID products based on various primary materials. Different end products are produced in the RFID conversion system by laminating different materials, in particular web shaped materials or sheet shaped materials. Self adhesive coated materials can be used or an adhesive can be applied directly in the machine using a hot melt unit. In principle, bonding with other types of adhesive is also possible. For example, reactive adhesives such as the special adhesive sold under the trade name UHU POR or PUR adhesives can be used.

RFID products manufactured in an RFID conversion system usually consist of a carrier material, an inlay, i.e. a thin substrate with an antenna and microchip, and, if necessary, a cover material. Special products may comprise further intermediate layers. In most cases, the carrier material and cover material are in the form of a web. The inlay is usually prefabricated as a continuous strip and wound into an inlay roll. Producing such an inlay roll usually occurs outside the RFID conversion system in an upstream production step in a separate plant. These ready made inlays are used as primary material for further processing onto RFID conversion systems.

Conventional RFID conversion systems comprise a large number of web guiding devices, such as deflection rollers, unwinders and rewinders. Depending on the desired end product, (hot) gluing devices, punching devices, reading and writing devices, printing devices and optical and electrical inspection devices, as well as slitting or cross cutting devices may also be provided. RFID conversion plants are available in single track or multi track configurations.

Producing RFID products in RFID conversion systems usually involves separating an inlay web and dispensing the separated inlays onto a carrier web. The inlays can either be in "dry" form, i.e. not adhesive, or as "wet inlays", i.e. already equipped with an adhesive layer. The inlays are arranged as densely as possible onto the inlay web, wherein an inlay pitch is specified. The term "inlay pitch" refers to a certain distance between two adjacent inlays in the direction of web transport. In most cases, however, the desired end product comprises a different pitch, which depends on the product and the product design. In conventional RFID conversion plants, the inlay web is therefore cut crosswise in a first process step in order to cut off individual inlays or to separate the inlays. These inlays are then placed individually onto the carrier web at the appropriate distance. Placement can take place in a continuous flow or in an intermittent start stop method. This makes it possible to laminate and/or further process the arrangement of inlays and carrier web with additional layers.

Another aspect of producing RFID products in RFID conversion systems relates to the so called "good check" of the inlays. Errors can occur in both the microchips and their contact with the antenna structures, which can result in RFID transponders not working at all or only working to a limited extent. Before application onto the carrier web, inlays are therefore often checked individually and defective inlays are ejected after detection and the inlay gap created by ejection is then closed. The aim is to produce end products with only defect free inlays. In the ongoing RFID conversion process, however, ejecting defective inlays and replacing them with defect free inlays is very complex. If the RFID conversion plant is operated in multiple tracks in order to increase production output, wherein several inlay and carrier tracks are processed in parallel, the process complexity and the susceptibility of the process to faults increases. The highest level of complexity is reached if a complete inspection of all inlays with replacement of defective inlays is to be carried out in a multi track configuration. Due to the design of known RFID conversion systems, it is always necessary to apply or eject all parallel inlays of an inlay track jointly. If the ejection of defective inlays does not take place, it is necessary to subsequently sort them in a separate process.

Inlay placement on the carrier web in known RFID conversion plants takes place in a centralized process, wherein the precise positioning of the individual inlays is achieved with a central dispensing unit. The inlay web is cut in the dispensing unit, positioned onto the product pitch in register and applied. This can be effected in one or several tracks.

If the material web reaches a final state onto an inlay roll of the dispensing unit, it is necessary to stop the RFID conversion system for the required change of the inlay roll. This leads to a significant reduction in production/plant runtime and reduces the efficiency of the plant. The roll change can be effected manually or automatically with a highly complex splice device.

To eject defective inlays and close the resulting gaps with defect free inlays, it is necessary to stop the RFID conversion system. The defective inlay can then be sucked out using a vacuum device and removed by other means. In known RFID conversion systems, the dispensing unit closes the resulting gap to the carrier material by means of a relative movement and the plant restarts in compound operation. This leads to frequent interruptions in production, which is a disadvantage.

If several tracks of products are processed in parallel in order to achieve a higher production output of the RFID conversion system, the loading of the individual tracks of carrier material by a central dispensing unit is complex, wherein handling and guiding the material strips in the correct track is demanding. In addition, the effort required to change the inlay rolls is also increased in the case of multiple tracks.

SUMMARY

The object of the present invention is to provide an RFID conversion system and a control method each of the type mentioned at the beginning, wherein the RFID conversion system according to the invention is characterized by higher production and system running times and a high degree of automation. In particular, simple scalability of the production capacity, simple operability and uninterrupted operation of the plant when an inlay supply at an inlay dispensing module is exhausted, in particular if the end of an inlay roll wound up as roll material is reached, are to be ensured. The RFID conversion system according to the invention and the control method according to the invention should furthermore allow the ejection and replacement of defective inlays in a simple manner and, in particular, without interrupting the operation of the system. Finally, it should be possible to achieve a higher register accuracy when placing inlays onto a carrier web.

According to the invention, an RFID conversion system for producing RFID products on one and/or more tracks is proposed, which comprises a plurality of inlay dispensing modules in place of a central dispensing station or a central dispensing unit, wherein each dispensing module is configured and set for direct loading of a carrier material, in particular a web shaped or sheet shaped carrier material, or for indirect inlay loading of a transport means, such as a vacuum conveyor belt, and wherein the dispensing modules can be controlled independently of each other.

At least two inlay dispensing modules, preferably all inlay dispensing modules, of the RFID conversion system according to the invention can be used as required and independently of each other for direct or indirect insertion and can be operated in different operating modes due to the different control, in particular as insertion modules, buffer modules or re dispensing modules or also as rewinding modules, for example to wind up a waste web from a neighboring dispensing module. In particular, several inlay dispensing modules can be operated simultaneously in different operating modes, wherein different operating modes can then be identified in particular by different placement capacities of the inlay dispensing modules, i.e. the number of inlays provided per hour, and/or different cycle times.

An "inlay" according to the invention relates in particular to a thin substrate material section with an antenna and microchip applied thereto, wherein the substrate material can be present in web or sheet form and a plurality of inlays in a row or in several adjacent rows can subsequently form an inlay web or an inlay sheet.

An inlay web is formed by a strip of substrate material onto which antenna structures with installed microchips are applied. An inlay sheet can be formed by a sheet shaped section of substrate material of a predetermined length and width onto which antenna structures with installed microchips are arranged in one or more rows.

Producing the inlays, i.e. the assembly of antennas and microchips, is preferably not part of the RFID conversion system and can be effected in an upstream production step in a separate machine or plant. The finished inlays are used as primary material for further processing onto the RFID conversion system according to the invention.

Due to different antenna geometries and requirements, inlays can comprise different dimensions and pitches on an inlay web. A central function of the RFID conversion system according to the invention can therefore be the separation of the inlay web and the dispensing of individual inlays onto the carrier material. For cost reasons, inlays are arranged as densely as possible onto an inlay web. The inlay pitch is therefore predetermined. The desired RFID product, for example a ticket, sticker or similar, usually has a different pitch, which depends on the product and its design and is also predetermined.

An "inlay dispensing module" according to the present invention is in particular meant and configured for separating inlays, which may be stored as an inlay web or inlay sheet, and for dispensing or applying separated inlays onto a carrier material or a transport means. However, an inlay dispensing module can also be meant and configured to dispense or apply thin sections of material from any flexible material onto a sheet or sheet like carrier material or a transport means, in particular after a prior cutting process to cut off sections of a material web or material sheet of the flexible material.

The dispenser modules can also be used in the application in such a way that different inlay types, for example for booster antennas, chip modules and/or HF and/or UHF mixed in one product, can be placed at the individual dispensing positions. The invention is not limited onto the placement of identical inlays.

The terms "placement module", "buffer module" and "Re dispensing module" are explained below using an example.

By suitably controlling the dispenser modules with different sequence patterns or operating modes of the dispenser modules, a large number of different operating or production modes can be realized during inlay placement with minimal adjustment work. Due to the possibility of controlling the dispenser modules of the RFID conversion system according to the invention independently of each other, they can fulfil different functions during placement as required and can be controlled individually and differently for this purpose.

As described at the beginning, producing the RFID products can take place using at least one material in particular in the form of a web and/or possibly using at least one further intermediate material in particular in the form of a web and/or at least one adhesive layer. Inlay dispensing modules can be used, for example, to dispense a cover material.

The RFID conversion system can provide for direct placement, i.e. precise positioning of inlays with at least one inlay dispensing module, onto a (continuous) carrier web or also placement onto carrier material sheets of a defined length. The carrier material can be single or multi layered. Indirect placement by dispensing the inlays onto a transport means, such as a vacuum conveyor belt, can also be provided, wherein the inlays are then transferred from the transport means onto the carrier material or carrier product.

To provide the inlays, inlay rolls wound up as rolls can be used as primary material, wherein the inlay webs unwound from the inlay rolls can be cut in a first process step in order to separate individual inlays.

Alternatively, inlay sheets can, for example, be removed from a storage stack or a storage container and cut to separate the inlays. Finally, it is also possible to store inlays that have already been separated and apply them using the inlay dispensing modules.

An inlay roll or an inlay sheet forms an inlay stock of the dispenser module, which is used up during loading and must be refilled at regular intervals, for example by changing the roll or refilling an inlay sheet storage unit.

An inlay dispenser module may preferably comprise a structure according to that of commercially available label dispensers used for labelling products in a continuous flow.

Preferably, a cutting device can be implemented in an inlay dispensing module in order to separate individual inlays from an inlay web or an inlay sheet.

The dispenser module can be meant and configured to hold an inlay roll or also to hold and store inlay sheets and comprise at least one such inlay roll or at least one such inlay sheet.

The dispenser module can also be meant and configured to hold a waste roll.

The dispenser module can be attached to a holding device of the RFID plant, in particular suspended in the plant, which enables lateral displacement transverse to the direction of travel and fine adjustment. In addition, the holding device can be designed in such a way that the dispenser module can also be rotated by 90° to the running direction, for example. This also allows inlays with a different orientation to be dispensed onto the carrier material. Furthermore, in particular, the dispensing module comprises at least one holder for an inlay roll and a dispensing tongue for dispensing individual inlays.

Separation can be made by a cutting device of the dispenser module.

Furthermore, the dispenser module may comprise a further holder for holding a cover web roll. In a further development, a dispenser module could also comprise a further winder for holding a waste web. In addition, at least one dispenser module, preferably each dispenser module, can comprise a reading and/or detection means, configured and set up for, in particular, contactless identification of defective inlays. Furthermore, an ejection means for ejecting defective inlays from the manufacturing process can be provided, further configured and set up in particular as a suction device for suctioning defective inlays and transferring the defective inlays into at least one collecting container.

The use of several dispenser modules makes it possible to design the dispenser modules for a lower number of cycles or placement capacity, so that the process of applying and, if necessary, cutting and testing the inlays can be configured much more robustly and accurately in relation to the individual dispenser module.

A control of the inlay dispensing modules can preferably be provided in such a way that, in the event of an interruption of an operating function of a first inlay dispensing module, this interrupted operating function is preferably automatically taken over and/or continued by at least one further inlay dispensing module, in particular following in the transport direction of a carrier material stream of the carrier material, in particular, wherein the takeover and/or continuation of the operating function is effected at the same transport speed and/or transport direction of the carrier material stream. Particularly preferred, the operating function relates to the placement of the individual inlays on the carrier material.

In particular, a control of the inlay dispensing modules can be provided in this context in such a way that the takeover and/or continuation of the operating function with the further inlay dispensing module is automatically terminated as soon as the first inlay dispensing module resumes or continues the interrupted operating function.

The dispenser modules of the RFID conversion system according to the invention can preferably be arranged one behind the other or in series in the transport direction of a carrier material stream, wherein at least two dispenser modules are arranged in a single track or on one track one behind the other or linearly in series. By arranging several dispenser modules linearly one behind the other, low cycle rates or placement capacities of the individual dispenser modules can be achieved in particular. The placement capacity of a dispenser module in placement mode can be in the range of less than 20,000 products per hour, for example 15,000 products per hour or less in particular. The cycle time per inlay in the single dispenser module can in particular be more than 100 ms, preferably more than 200 ms, for example 240 ms. The higher cycle times per inlay in the single dispenser module allow sufficient time for a comprehensive inspection of the products even at full production output, which is a decisive advantage.

If more than two dispenser modules are arranged one behind the other in a single lane, the inlay dispenser modules can be controlled in such a way that if an operating function of at least one inlay dispenser module preceding in the transport direction of the RFID products is interrupted, the interrupted operating function is preferably automatically taken over and/or continued by at least one inlay dispenser module following in the transport direction.

For example, at least one first inlay dispensing module can be provided as a placement module and at least one further inlay dispensing module as a buffer module, wherein control of the inlay dispensing modules is provided in such a way that when placement with the first inlay dispensing module (placement module) is interrupted, in particular when an inlay supply is exhausted, which may be indicated when a minimum diameter of an inlay roll is reached, placement is preferably continued automatically with the further inlay dispensing module (buffer module). The second inlay dispensing module then fulfils a buffer function. Both modules can achieve the same maximum placement performance and be configured in the same way. The cycle rate of the buffer module can correspond to the cycle rate of the placement module.

If at least two, preferably more than two, inlay dispensing modules are arranged one behind the other in a single track, the inlay dispensing modules can be controlled in such a way that, if the placement of at least one preceding inlay dispensing module (placement module) in the carrier material track is interrupted, the placement is preferably effected automatically with at least one further inlay dispensing module (buffer module) following in the carrier material track in the material transport direction. The respective subsequent module then operates as a buffer module. However, the invention also allows several buffer modules to be provided or the buffer function to be fulfilled by several dispenser modules.

To increase productivity, several inlay dispensing modules can be arranged one behind the other on a single track, wherein the inlay dispensing modules are controlled in such a way that placement is effected simultaneously with several inlay dispensing modules at reduced dispensing module cycle rates compared to placement with just one inlay dispensing module. Alternatively, the control can also be provided in such a way that loading is always effected with only one inlay dispensing module.

In an alternative embodiment of the RFID conversion system according to the invention, at least one first inlay dispensing module can be provided as a placement module and at least one further inlay dispensing module can be provided as a re-dispensing module, wherein at least one defective inlay of the first inlay dispensing module is detected and ejected and wherein a control of the inlay dispensing modules is provided in such a way that an inlay gap in an inlay stream resulting from the ejection of a defective inlay is automatically closed by dispensing a defect free inlay with the further inlay dispensing module (re-dispensing module). Preferably, the re dispensing module only stores "good inlays" that have already been checked for defects. Detection and ejection can be performed with the first inlay dispensing module, which comprises a detection device and ejection device according to this. Due to the closing of the gap by the re dispensing module, no stop of the plant or the carrier material transport is required, nor is a change in the transport direction of the carrier material and, in particular, no relative movement between the first inlay dispensing module and the carrier material stream. Detection and, preferably, ejection are effected in particular by the first dispensing module, while the further dispensing module operates as a re-dispensing module and can be arranged downstream of the first dispensing module in the transport direction of the carrier material, in particular in the web transport direction of the carrier web. The re dispensing module then closes a gap created by the ejection in the inlay stream downstream.

It is expedient if at least two dispenser modules, preferably all dispenser modules, are configured identically and/or can be operated as a placement module, buffer module and/or re dispensing module as required. In particular, the control device is configured to determine the current or instantaneous operating mode of at least one dispenser module as a placement module, buffer module and/or re dispenser module, in particular of all dispenser modules, during the producing of the RFID products as a function of the current or instantaneous operating mode of at least one other dispenser module, in particular of all other dispenser modules. This allows a large number of different production modes to be realized and ensures uninterrupted operation of the plant in the event of consumption and replenishment of an inlay supply, in particular a change of inlay roll, and/or when defective inlays are ejected and replaced by defect free inlays.

For easy switching between a single track and multi track production method, at least one dispensing module can be adjustable, in particular displaceable, onto different lanes of carrier material, i.e. transversely to the transport direction of a carrier material stream or product stream of RFID products. The laterally displaceable dispensing module can then, for example, be operated as a buffer module and/or a re-dispensing module as required.

Preferably, there is no change of position of the dispensing modules in or against the transport direction of the carrier material stream while the RFID products are being produced. The positioning of the dispensing modules onto a specific carrier material track, i.e. the setting of the position of the dispensing modules transverse to the transport direction of the carrier material stream or product stream of the RFID products, is preferably effected manually and is preferably not changed during the manufacturing process of the RFID products. The positioning of the dispensing modules onto a specific carrier material track is then constant.

At least one dispensing module can also be provided as a jumper module and can be adjusted laterally onto different tracks of carrier material. The positioning of the jumper module onto a carrier material track can be effected manually or automatically. Preferably, only one dispensing module is provided as a jumper module and is controlled according to this.

A continuous production of the RFID products is particularly preferred, in which a start and stop operation of the carrier material web or the means of transport does not occur.

If multi track producing of RFID products is provided, wherein each carrier material track is provided with at least one inlay dispensing module as a placement module and at least one further inlay dispensing module as a buffer module, which is laterally adjustable onto different carrier material tracks, in particular displaceable, a control of the inlay dispensing modules can be provided in such a way that the inlay supply of the placement modules, in particular the roll end of an inlay roll of the respective placement module, is consumed or reached with a time delay, in particular wherein the start of the placement with placement modules arranged on different carrier material tracks takes place with a time delay. A specific control algorithm can be used, for example, to ensure that inlay rolls reach the end of the roll at different times and need to be replaced. An automated changeover is then possible with the help of the buffer module, which is used as a jumper.

In particular, placement with a buffer module according to the invention can only be effected if a first inlay dispensing module (placement module) upstream in the transport direction of the carrier material stream can no longer fulfil the placement function due to an exhausted inlay supply, for example when the end of an inlay roll is reached, and/or in the event of an operational malfunction. During proper placement by the upstream placement module, on the other hand, the buffer module can preferably stand still and not be used for placement or for placement of another upstream inlay dispensing module that is arranged onto a different carrier material track and whose placement function is currently interrupted.

Preferably, placement with a re-dispensing module according to the invention only effects the filling of gaps that have been created by ejecting defective inlays that have been dispensed with a first inlay dispensing module (placement module) upstream in the transport direction of the carrier material stream. In this context, the control of the inlay dispensing modules can, in particular, stipulate that a re-dispensing module is not used purely as a placement module. Accordingly, the cycle rate of the re dispensing module can be lower than the cycle rate of a placement module.

BRIEF DESCRIPTION OF THE DRAWINGS

In the following, the invention is described with reference to embodiments, wherein the invention is not limited onto the described embodiments. The drawing shows

DETAILED DESCRIPTION

Figure 1A:
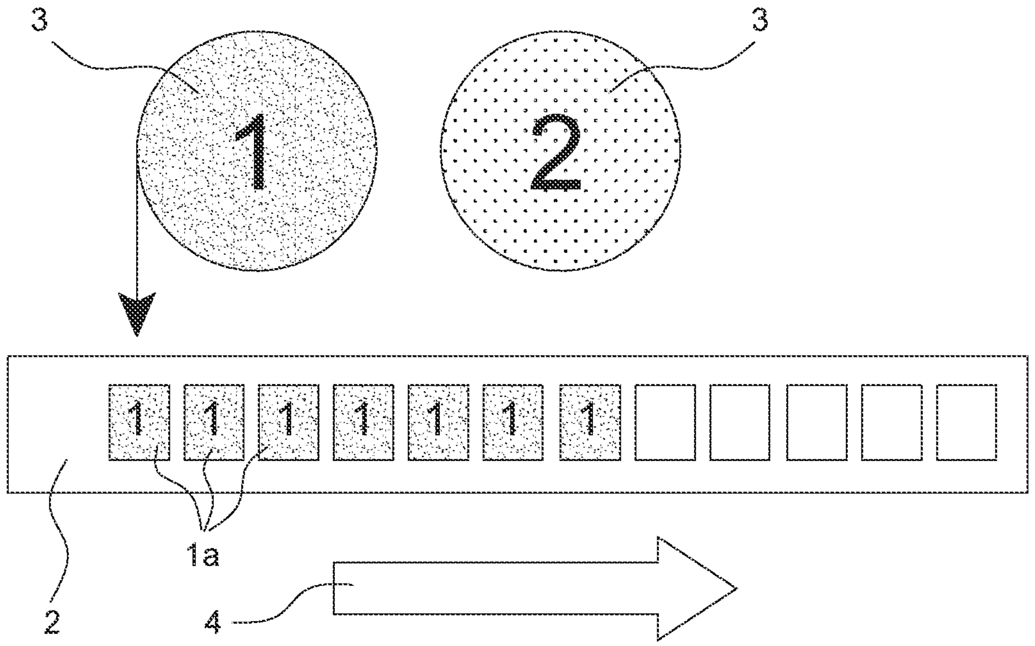
FIGS. 1A and 1B are schematic representations of the roll change of an inlay roll of an inlay dispensing module of an RFID conversion system according to the invention with single lane or single track producing of RFID products with the use of a further inlay dispensing module as a buffer module.
Figure 1B:
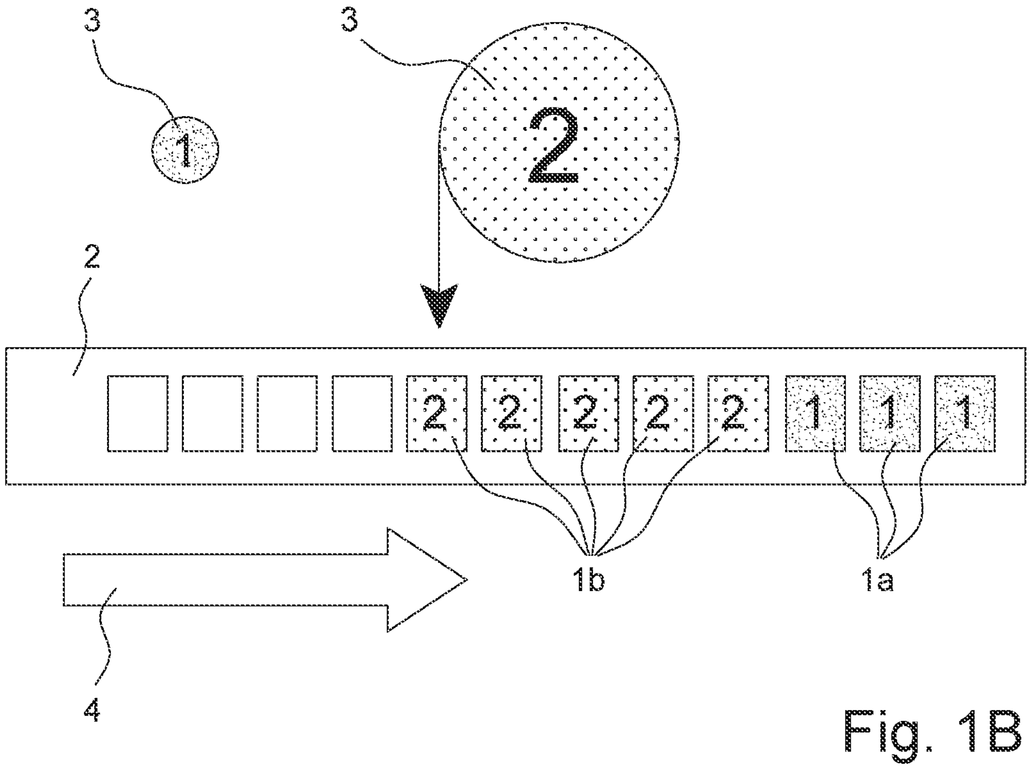

FIGS. 1A and 1B schematically show the system concept of an RFID conversion system for producing RFID products on a single track. In the exemplary assumption, the placement, i.e. the dispensing, of inlays 1*a* onto a web or sheet shaped carrier material 2 is effected only with a first inlay dispensing module 3, which operates as a placement module. Following in the transport direction 4 of the carrier material 2, a further inlay dispensing module 3 is provided, which is on standby with the inlay roll inserted. When the end of an inlay roll inserted into the first inlay dispensing module 3 is reached, the operating function of the dispensing module 3 or the placement of the dispensing module 3 is automatically terminated. The further inlay dispensing module 3 then takes over the placement work without interruption, wherein inlays 1*b* are dispensed onto the carrier material 2 from the inlay roll of the further inlay dispensing module 3 (FIG. 1*b*). The process is reversed as soon as the inlay roll of the additional inlay dispensing module 3 reaches the end. In this case, the machine control system automatically effects a placement change back onto the first inlay dispensing module 3, which then takes over the placement work of the other inlay dispensing module 3 without interruption. With a single track, two inlay dispensing modules 3 arranged one behind the other are therefore sufficient to enable uninterrupted operation of an RFID conversion system during a roll change.

Figure 2A:
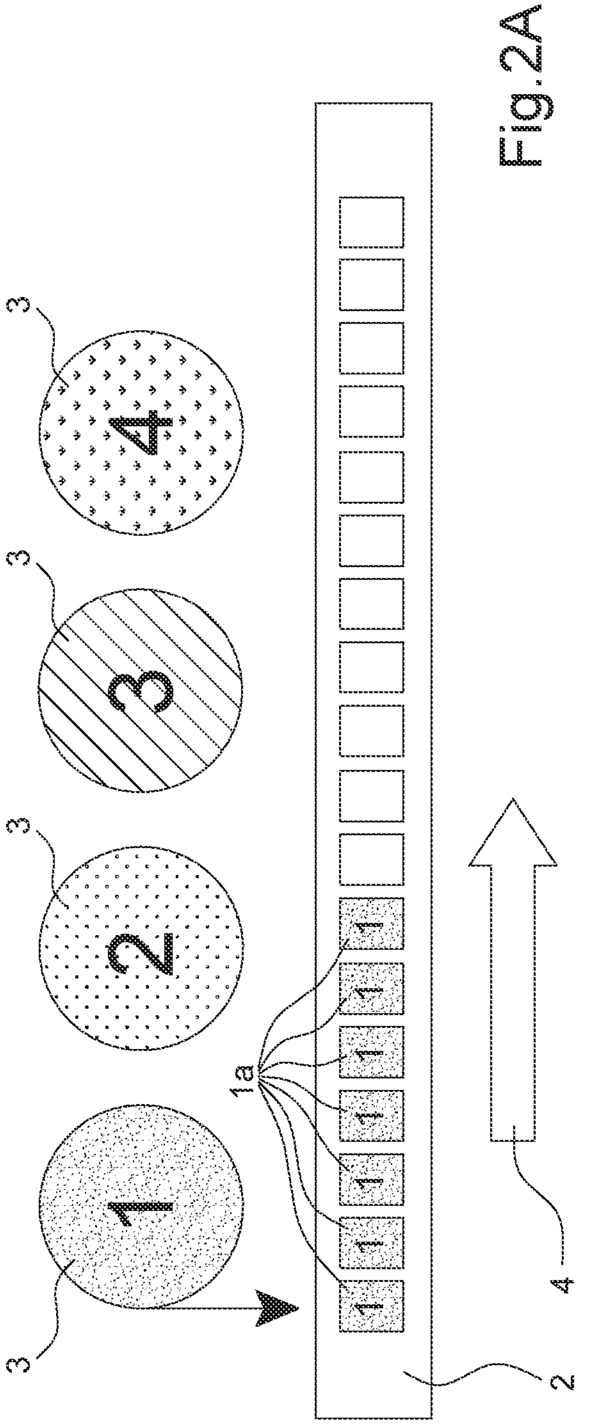
FIGS. 2A and 2B are schematic representations of the roll change of an inlay roll of an inlay dispensing module of an RFID conversion system according to the invention with single lane or single track producing of RFID products with the use of three further inlay dispensing modules as buffer modules.
Figure 2B:
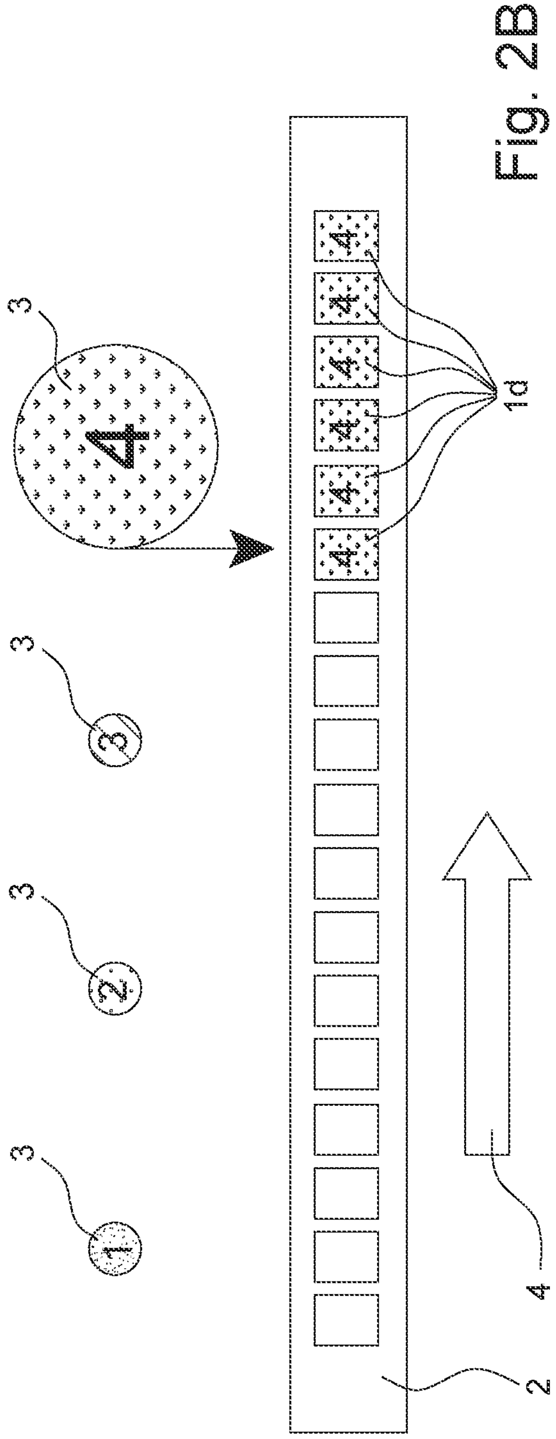

With high production output and small inlay rolls, the effort involved in changing rolls increases. The parallel operation of another machine or a short absence of the machine operator is hardly possible without interrupting production. It is therefore advantageous if, as shown in FIGS. 2A and 2B, more than one further inlay dispensing module 3 is provided as a buffer module, for example three buffer modules according to the embodiment shown. A longer uninterrupted production phase is possible due to the plurality of buffer modules. This function can be achieved if a total of more than two dispensing modules 3 are installed, which can perform a placement function.

Preferably, loading is always effected with only one dispensing module 3. The three other inlay dispensing modules 3 are automatically activated by the machine control system at the end of the inlay roll of a previous dispensing module 3 and used for placement. This enables a longer production phase without operator intervention during a roll change, starting with the first dispensing module 3 and then subsequently with the other dispensing modules 3. This gives the machine operator a longer time window to complete other objects.

FIG. 2B shows, for example, that the placement function of the carrier material 2 is taken over by a further inlay dispensing module 3 with inlays 1*d*, which is foremost in the transport direction 4, after the inlay rolls of all preceding dispensing modules 3 have reached the respective end of the roll.

Figure 3:
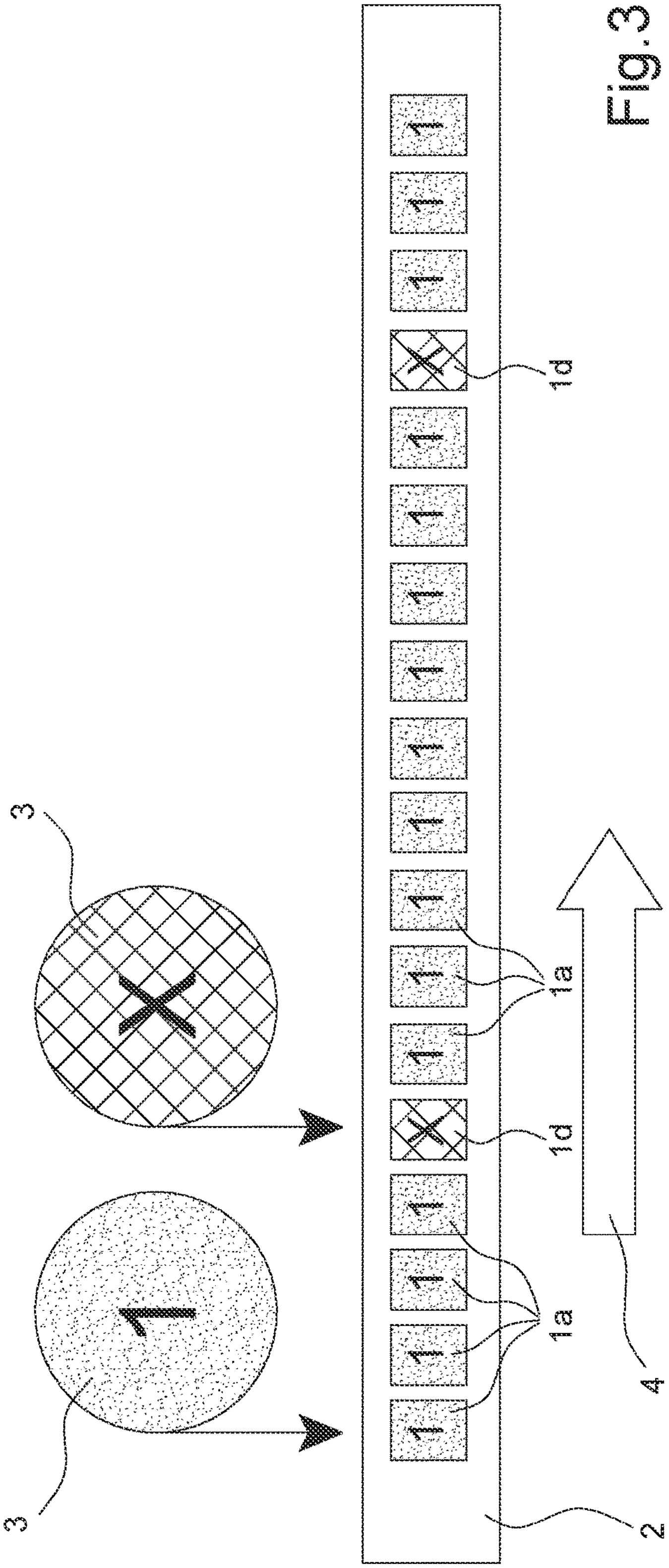
FIG. 3 is a schematic representation of the use of a further inlay dispensing module as a re-dispensing module in an RFID conversion system according to the invention for single lane or single track producing of RFID products.

FIG. 3 schematically shows the use of a further inlay dispensing module 3 as a re dispensing module. In the case of single track dispensing, two dispensing modules 3 arranged one behind the other are sufficient to enable the detection and ejection of faulty inlays and to close any resulting gap by re dispensing a fault free inlay 1*d* from the inlay roll of the re dispensing module. If, for example, a faulty inlay is detected in the first inlay dispensing module 3, it is ejected. The resulting gap is not closed by the dispensing module 3, as this is not possible at high production speeds. Instead, the re dispensing module 3 is in the waiting position with an inlay 1*d* that has been checked as faultless. As soon as the gap has reached the re dispensing module 3, it places an inlay 1*d* in the gap and thereby closes the gap.

Figure 4:
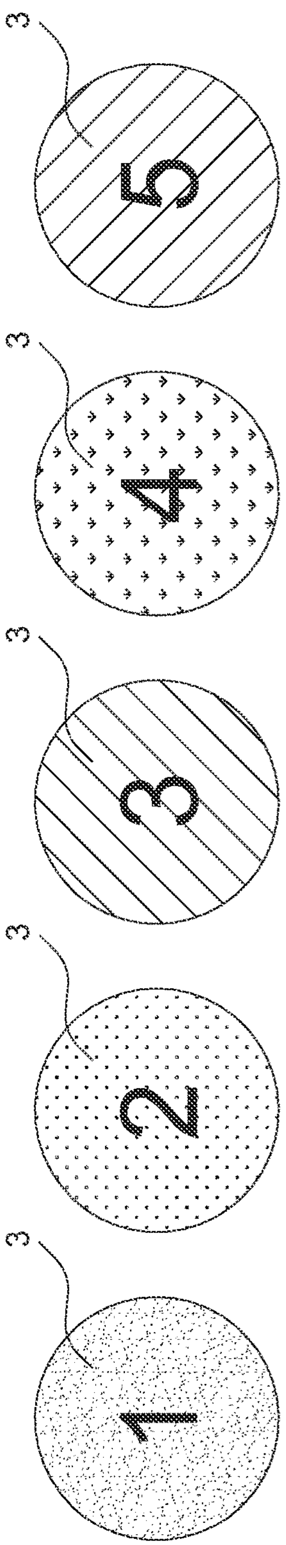
FIG. 4 is a schematic representation of possible sequences for installations of five inlay dispensing modules in an RFID conversion system according to the invention for single lane or single track producing of RFID products.

The described inlay dispensing modules 3 can be configured in the same way and can be used in particular as a placement module, buffer module and/or as a re-dispensing module by means of a corresponding control. FIG. 4 shows an example of the installation of five dispensing modules 3 in order to enable different sequences or function assignments of the dispensing modules 3 in single track operation. There are many different sequencing options. For example, as represented, the first two inlay dispensing modules 3 can be provided for placement. The two further dispensing modules 3 following in the transport direction can be used as buffer modules and take over the placement function if the inlay rolls of the preceding dispensing modules 3 have reached the end. The further inlay dispensing module 3 foremost in the transport direction can be used as a re-dispensing module to close gaps created by ejecting faulty inlays. Alternatively, it is also possible to provide the placement with only the first inlay dispensing module 3, while the four following additional inlay dispensing modules 3 are only provided as roll change modules or buffer modules. Alternatively, placement can also be effected with the first four inlay dispensing modules 3, wherein the foremost further inlay dispensing module 3 can be provided for a roll change or as a re-dispensing module. Should a dispensing module 3 fail due to a technical defect or require service, for example to replace worn blades, the RFID plant can continue to be operated with the remaining dispensing modules 3. The machine control system is then able to form new sequences with the remaining functional dispensing modules 3.

Figure 5:
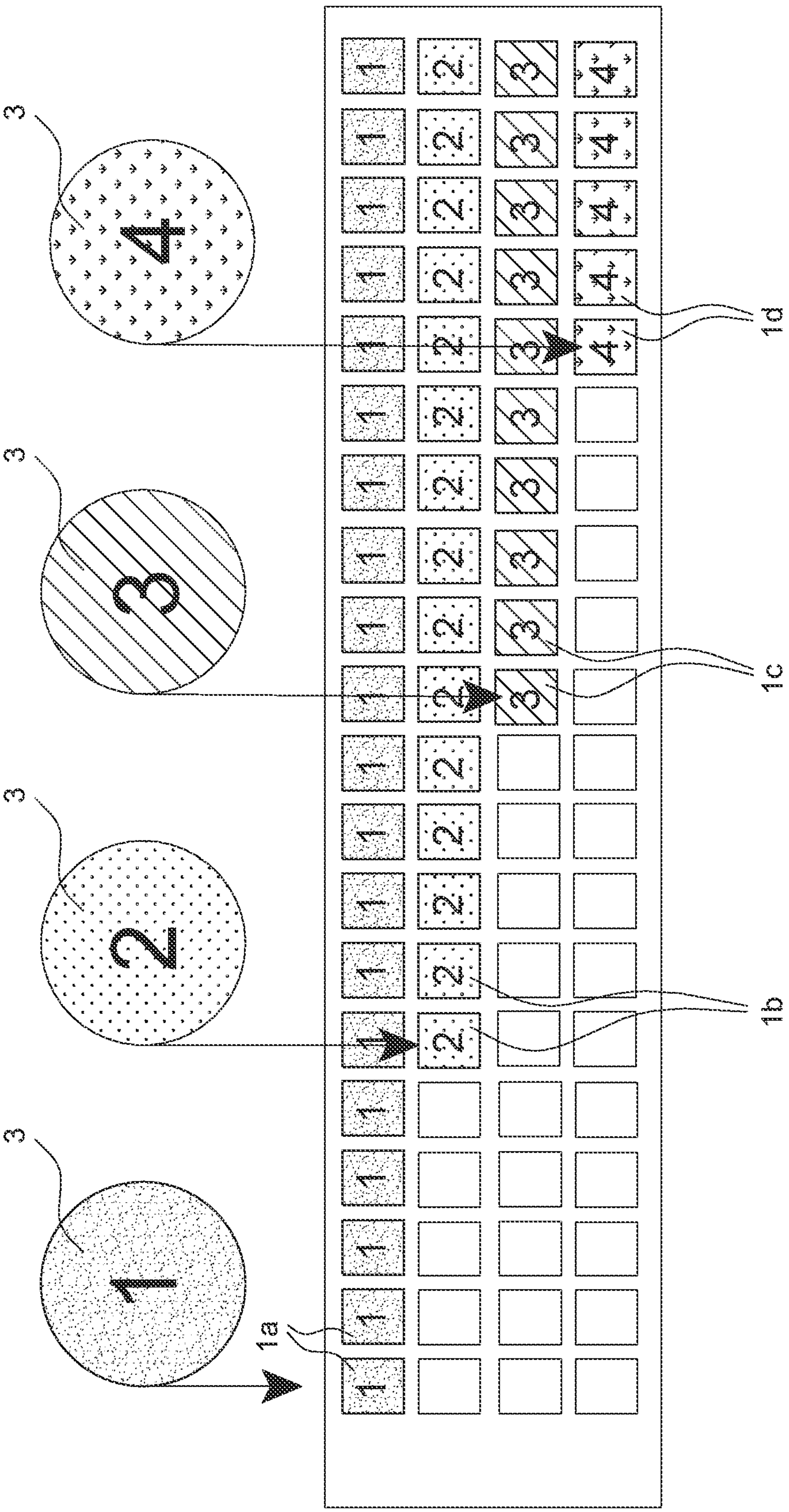
FIG. 5 is a schematic representation of a multi track operating mode of an RFID conversion system according to the invention with several inlay dispensing modules.

To achieve multi track operation, inlay dispensing modules 3 can also be moved sideways, i.e. transverse to the track direction. The total production capacity of the RFID plant with several lanes or tracks then corresponds to the sum of the individual production capacities of the inlay dispensing modules 3. This is shown schematically in FIG. 5.

Figure 6:
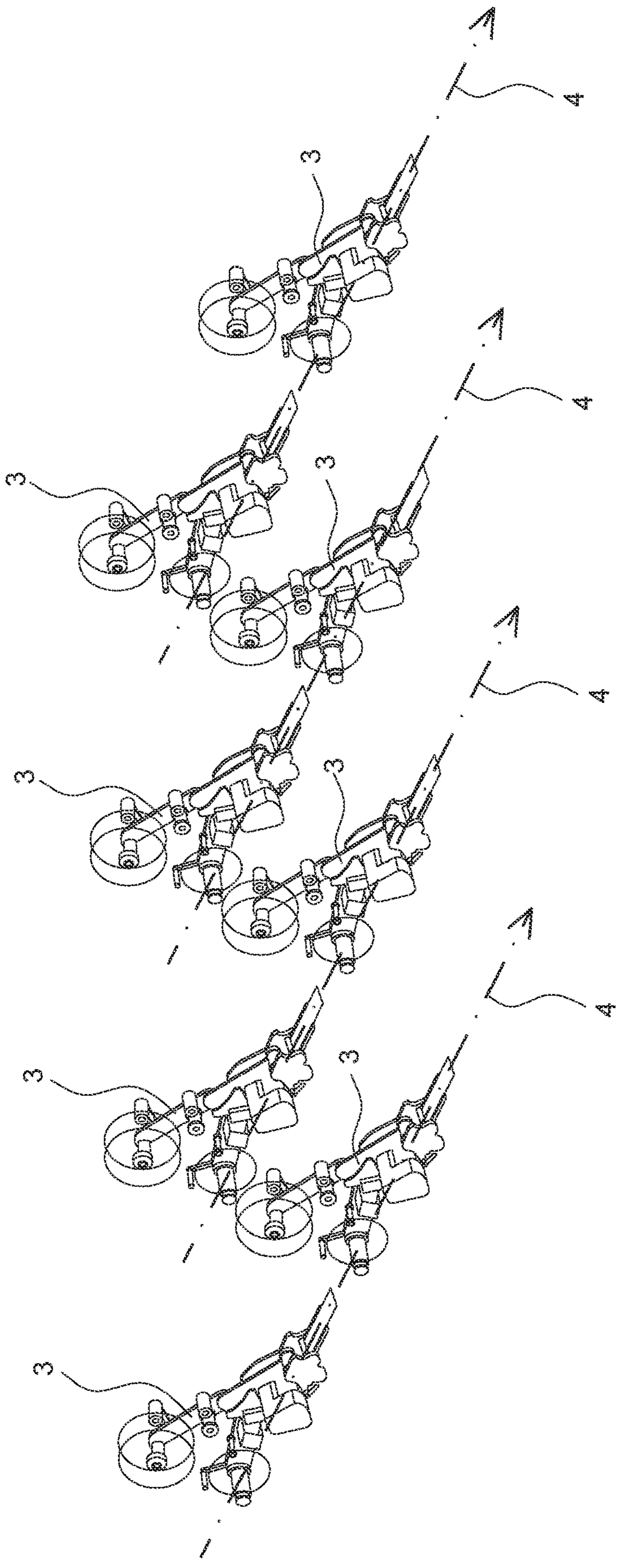
FIG. 6 is a schematic representation of the multi track producing of RFID products with an RFID converting system according to the invention, wherein several inlay dispensing modules are provided as re dispensing modules in order to close inlay gaps resulting from the ejection of faulty inlays by dispensing fault free inlays.

In principle, multi track operation is also possible in such a way that a further inlay dispensing module 3 is provided as a re-dispensing module for each track or lane. Each track then comprises a first inlay dispensing module 3 as a placement module and a further inlay dispensing module 3 downstream in the transport direction 4 of the carrier material as a re dispensing module in order to close gaps that have resulted from the ejection of defective inlays. The ejection can preferably be effected with the placement modules, which are meant and configured according to. This is shown schematically in FIG. 6.

Figure 7:
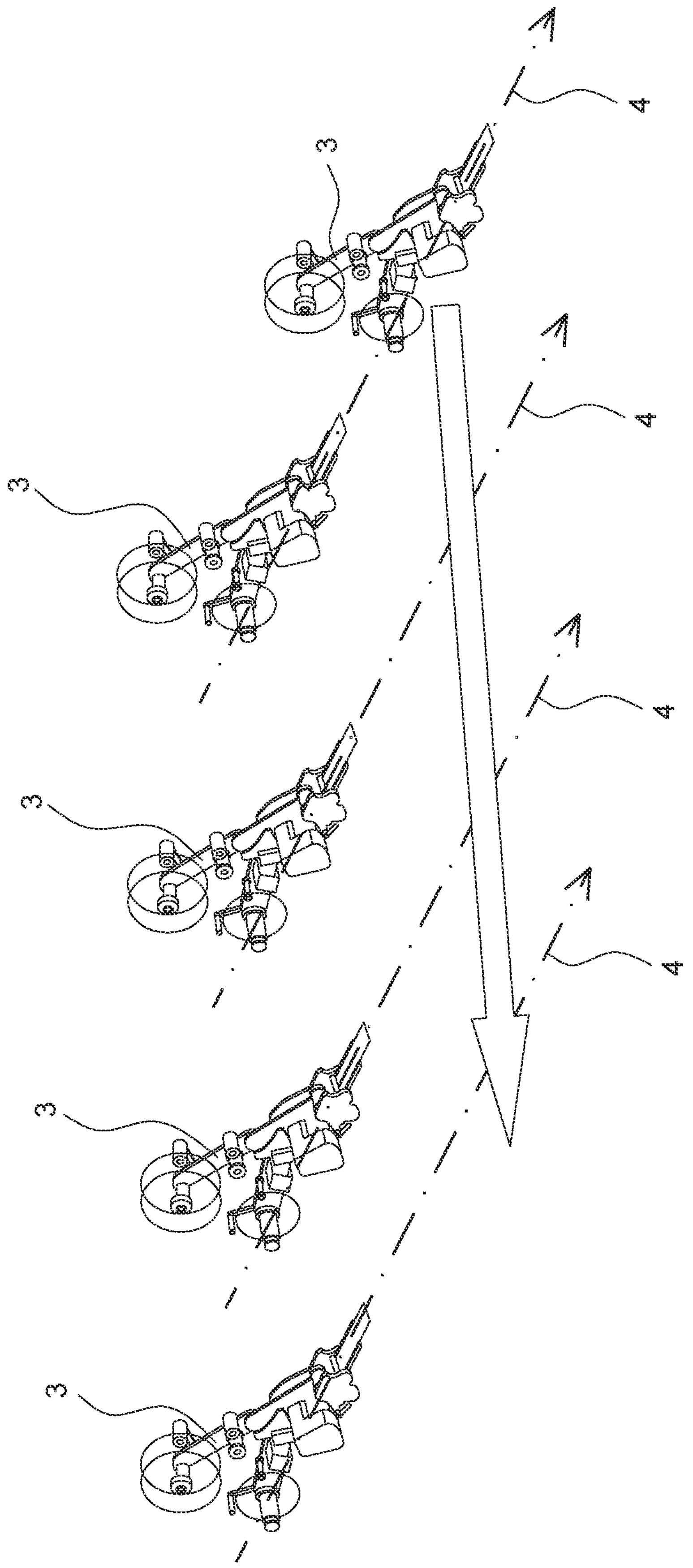
FIG. 7 is a schematic representation of the multi lane or multi track producing of RFID products, wherein a further inlay dispensing module is provided as a buffer module for a roll change of the inlay rolls of the inlay dispensing modules.

FIG. 7 schematically shows, in an exemplary embodiment with five dispensing modules 3, the simultaneous placement of, for example, four material webs or tracks of the RFID conversion system with four first inlay dispensing modules 3, which fulfil the placement function. Another inlay dispensing module 3 is designed as a jumper module that can be adjusted laterally onto all tracks and can jump in for the first inlay dispensing modules 3 if their inlay rolls have reached the end. A smart control algorithm can be used to ensure that the inlay rolls of the first inlay dispensing modules 3 reach the end of the roll at different times. At the start of a new production run, for example, the four first inlay dispensing modules 3 can be scheduled to stick to pause times of different lengths. During the time in which a first inlay dispensing module 3 pauses, its placement work is taken over by the other inlay dispensing module 3 as a jumper module. The jumper module can be automatically moved onto the respective track laterally on a linear guide. The algorithm behind the pause sequence can follow from the Gaussian summation formula. During the establishment of a time offset, with which the first inlay dispensing modules 3 begin the placement process, the RFID plant can be operated at reduced power. Once the inlay rolls of all five dispensing modules 3 provided in the embodiment example shown have been changed for the first time, an initial offset has been configured and the production speed can be increased. No further interruptions to operation are then necessary, as in future all inlay rolls will reach the end of the roll at different times. The RFID plant can run through without further interruptions.

Figure 8:
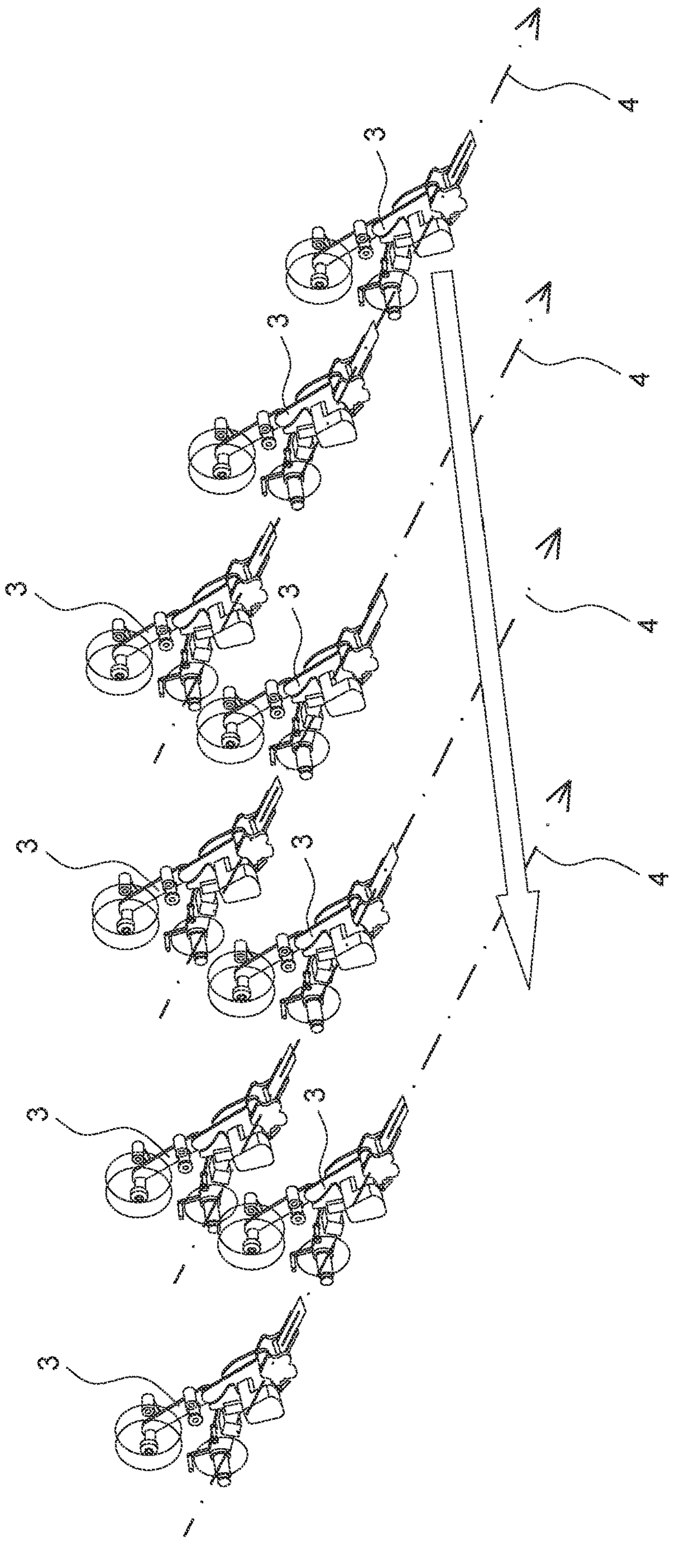
FIG. 8 is a schematic representation of the multi lane or multi track producing of RFID products, wherein several inlay dispensing modules are provided as placement modules, further inlay dispensing modules as re dispensing modules and a further inlay dispensing module as a buffer module for a roll change of the inlay rolls of the placement modules.

A combination of buffer modules and re dispenser modules is also possible without further ado. In the design example shown in FIG. 8, a total of nine dispensing modules 3 are provided. On each track, at least one first inlay dispensing module 3 is provided as a placement module and at least one downstream inlay dispensing module 3 as a re-dispensing module. The first four inlay dispensing modules 3 in the case of four tracks of the plant, for example are responsible for the actual placement. Four further inlay dispensing modules 3 are available to replace a missing inlay or an inlay gap caused by the ejection of a faulty inlay with a good inlay as re dispensing modules onto the respective track. At least one further inlay dispensing module 3, preferably only one further inlay dispensing module 3, is positioned in front of the other dispensing modules 3 in the transport direction 4 or at the end of the module chain in order to be able to provide an automated roll change as a buffer or jumper module that can be adjusted laterally onto all tracks. This further inlay dispensing module 3 is meant and configured in such a way that it can be offset or moved onto the respective track.

Figure 9:
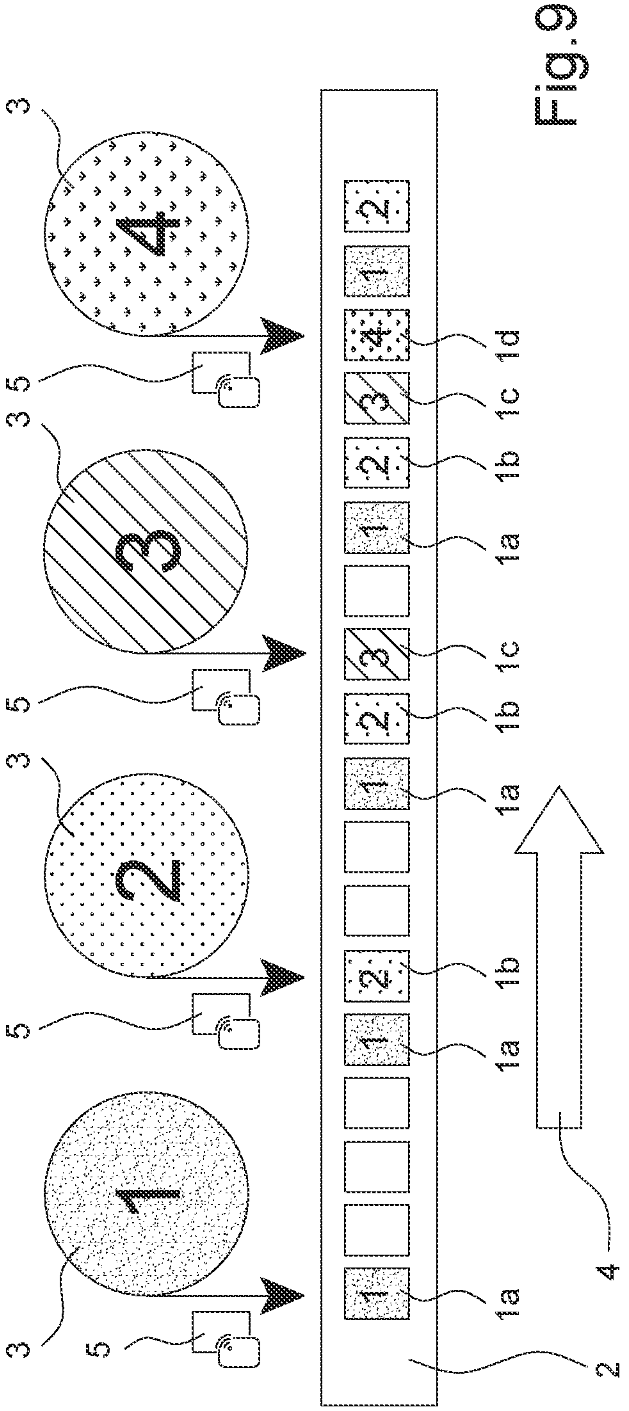
FIG. 9 is a schematic representation of the arrangement of several inlay dispensing modules as placement modules in linear succession for single lane or single track producing of RFID products and integrated good inspection of the inlays using radio.

To ensure that the RFID products are error free, it is necessary to check each individual inlay. This is shown schematically in FIG. 9. The test is effected using electromagnetic transmission, in particular via a high frequency magnetic (proximity) field, and examines the correct functioning of the antenna and microchip. Depending on the scope of the test, a time window of up to 100 ms per inlay is required. For example, if a machine produces at a rate of 60,000 products per hour, a theoretical time period of 60 ms remains for testing each individual product. A comprehensive inspection is therefore not possible. A linear arrangement of several inlay dispensing modules 3, which are operated at a lower cycle rate, provides a remedy as shown in FIG. 9. For example, the RFID conversion system can produce 60,000 products per hour. Thus, in the embodiment shown as an example in FIG. 9, the production rate per dispensing module 3 is only 15,000 products per hour. This increases the cycle time per inlay 1*a*-1*d* in the respective dispensing module 3 from 60 onto 240 ms. This makes it possible to shift the inspection of the inlays 1*a*-1*d* to the respective dispensing module 3, wherein there is still enough time for extensive inspection of the RFID products even at full production output of the RFID conversion system. This is represented schematically in FIG. 9 by the radio symbol 5.

Figure 10:
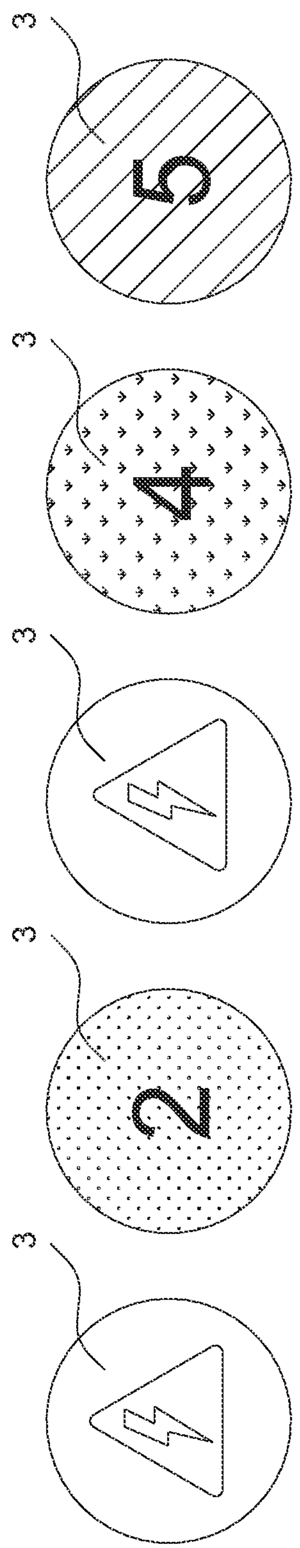
FIG. 10 is a schematic representation of the arrangement of several inlay dispensing modules in an RFID conversion system according to the invention to increase system availability.

According to FIG. 10, the machine control of an RFID conversion system can also allow individual inlay dispensing modules 3 to be deactivated. In the example shown, for example, the first and third inlay dispensing modules 3 assigned to a material track are deactivated. For example, individual dispensing modules 3 can be removed from the production process during maintenance work, such as knife replacement, toothed belt replacement, cleaning or similar, and in the event of faults on the dispensing modules 3. The RFID plant or its control device preferably recognizes a changed operating situation of individual dispensing modules 3 automatically, which preferably leads to an automatic adaptation of the sequences, i.e. the operating mode or function assignment of the operational dispensing modules 3, wherein these can be used as a placement module, buffer module or re dispensing module depending on the sequence. The overall system remains ready for operation and production can continue with reduced output or a reduced range of functions if necessary.

In all the embodiments described above, the number of dispensing modules 3 is selected by way of example. All dispensing modules 3 are preferably configured identically, in particular in the manner of label dispensers. Each dispensing module 3 can be operated with a machine controller preferably and as required as a placement module, buffer or jumper module or re dispensing module in the mode of operation described in each case. In the system periphery, holding devices are preferably provided for holding the dispensing modules 3 as required.

LIST OF REFERENCE SYMBOLS

1*a*-1*d* Inlay
2 Carrier material
3 Inlay dispensing module
4 Transport direction
5 Radio symbol

The invention claimed is:

1. A RFID conversion system for single-track or multi-track production of RFID products, the RFID conversion system comprising:

a plurality of inlay dispensing modules; and a control device for controlling the inlay dispensing modules;

wherein inlay rolls or inlay sheets are used as primary material to provide inlays and form an inlay stock of the inlay dispensing modules;

wherein each inlay dispensing module is meant and configured for direct placement of inlays onto a carrier material or for indirect placement of inlays onto a transport means; and wherein the inlay dispensing modules can be controlled independently of each other and can be operated in different operating modes.

2. A RFID conversion system for single-track or multi-track production of RFID products, the RFID conversion system comprising:

a plurality of inlay dispensing modules; and a control device for controlling the inlay dispensing modules;

wherein each inlay dispensing module is meant and configured for direct placement of inlays onto a carrier material or for indirect placement of inlays onto a transport means;

wherein the inlay dispensing modules can be controlled independently of each other and can be operated in different operating modes; and wherein a control of the inlay dispensing modules is provided in such a way that, in the event of an interruption of an operating function of a first inlay dispensing module, the interrupted operating function of the first inlay dispensing module is preferably automatically taken over and/or continued by at least one further inlay dispensing module.

3. The RFID conversion system according to claim 1, wherein more than two inlay dispensing modules are arranged one behind the other in a single track and wherein a control for the inlay dispensing modules is provided in such a way, that in the event of an interruption of an operating function of at least one inlay dispensing module preceding in the transport direction of a carrier material stream of the carrier material, the interrupted operating function is automatically taken over and/or continued by at least one inlay dispensing module following in the transport direction.

4. The RFID conversion system according to claim 1, wherein at least one first inlay dispensing module is provided as a placement module and at least one further inlay dispensing module is provided as a buffer module, and wherein a control of the inlay dispensing modules is provided in such a way, that if the placement with the first inlay dispensing module is interrupted, the placement is continued automatically with the further inlay dispensing module.

5. The RFID conversion system according to claim 1, wherein at least two inlay dispensing modules are arranged one behind the other in a single track and wherein a control for the inlay dispensing modules is provided in such a way, that when the placement of at least one inlay dispensing module preceding in the transport direction of a carrier material stream of the carrier material is interrupted, the placement is preferably effected automatically with at least one inlay dispensing module following in the transport direction.

6. The RFID conversion system according to claim 1, wherein a plurality of inlay dispensing modules are arranged one behind the other in a single track and wherein a control for the inlay dispensing modules is provided in such a way that placement with a plurality of inlay dispensing modules is effected simultaneously.

7. A RFID conversion system for single-track or multi-track production of RFID products, the RFID conversion system comprising:

a plurality of inlay dispensing modules; and a control device for controlling the inlay dispensing modules;

wherein each inlay dispensing module is meant and configured for direct placement of inlays onto a carrier material or for indirect placement of inlays onto a transport means;

wherein the inlay dispensing modules can be controlled independently of each other and can be operated in different operating modes; and wherein at least one first inlay dispensing module is provided as a placement module and at least one further inlay dispensing module is provided as a re-dispensing module, wherein at least one defective inlay dispensed by placement with the first inlay dispensing module is detected and ejected and wherein a control of the inlay dispensing modules is provided in such a way that an inlay gap resulting from the ejection of the defective inlay is closed by dispensing a defect-free inlay with the further inlay dispensing module.

8. The RFID conversion system according to claim 1, wherein at least two inlay dispensing modules are configured identically and/or wherein a control of the inlay dispensing modules is provided in such a way that the inlay dispensing modules can be operated as a placement module, buffer module and/or re-dispensing module as required.

9. A RFID conversion system for single-track or multi-track production of RFID products, the RFID conversion system comprising:

a plurality of inlay dispensing modules; and a control device for controlling the inlay dispensing modules;

wherein each inlay dispensing module is meant and configured for direct placement of inlays onto a carrier material or for indirect placement of inlays onto a transport means;

wherein the inlay dispensing modules can be controlled independently of each other and can be operated in different operating modes; and wherein multi-track producing of RFID products is provided, wherein at least one inlay dispensing module is laterally adjustable onto different carrier material tracks.

10. The RFID conversion system according to claim 1, wherein multi-track producing of RFID products is provided, wherein each carrier material track is provided with at least one inlay dispensing module as a placement module and at least one further inlay dispensing module which is laterally adjustable onto different carrier material tracks as a buffer module and wherein a control of the inlay dispensing modules is provided in such a way that the inlay supply of the inlay dispensing modules is consumed with a time delay.

11. A method for controlling an RFID conversion system, wherein a control of a plurality of inlay dispensing modules of the RFID conversion system according to claim 1 is provided.

12. The RFID conversion system according to claim 1, wherein the carrier material is a web-shaped or sheet-shaped carrier material.

13. The RFID conversion system according to claim 1, wherein the transport means is a vacuum conveyor belt.

14. The RFID conversion system according to claim 2, wherein the at least one further inlay dispensing module follows in the transport direction of a carrier material stream of the carrier material.

15. The RFID conversion system according to claim 2, wherein the takeover and/or continuation of the operating function is effected at the same transport speed and/or transport direction of the carrier material stream.

16. The RFID conversion system according to claim 4, wherein the placement is continued automatically with the further inlay dispensing module if an inlay supply of the first inlay dispensing module is exhausted.

17. The RFID conversion system according to claim 8, wherein all the inlay dispensing modules are configured identically.

18. The RFID conversion system according to claim 10, wherein the start of the placement with inlay dispensing modules arranged onto different carrier material tracks is effected with a time delay.

* * * * *